United States Patent [19]

Kawamura et al.

[11] Patent Number: 5,365,034
[45] Date of Patent: Nov. 15, 1994

[54] DEFECT DETECTION AND DEFECT REMOVAL APPARATUS OF THIN FILM ELECTRONIC DEVICE

[75] Inventors: Tetsuya Kawamura; Hiroshi Sano; Mamoru Furuta; Tatsuo Yoshioka, all of Hirakata; Yutaka Miyata, Ikoma, all of Japan

[73] Assignee: Matsushita Electric Industrial Co., Ltd., Kadoma, Japan

[21] Appl. No.: 126,209

[22] Filed: Sep. 24, 1993

[30] Foreign Application Priority Data

Sep. 29, 1992 [JP] Japan .................................. 4-259552

[51] Int. Cl.⁵ .............................................. B23K 26/02
[52] U.S. Cl. ............................ 219/121.83; 219/121.69
[58] Field of Search ..................... 219/121.68, 121.69, 219/121.83; 324/158 R

[56] References Cited

U.S. PATENT DOCUMENTS

| 4,240,094 | 12/1980 | Mader | 219/121.64 X |
|---|---|---|---|
| 4,259,367 | 3/1981 | Dougherty, Jr. | 219/121.69 X |
| 4,358,659 | 11/1982 | Spohnheimer | 219/121.62 |

OTHER PUBLICATIONS

Katayama et al.: High-Resolution Full-Color LCDs Addressed by Double-Layered Gate-Insulator a-SI TSTs SID 88 Digest; pp. 310–313.

Henley, F. J.: "Flat-Panel in-Process Test, Repair and Inspection: An Overview"; SID 92 Digest; pp. 623–627.

"7 Laser Microscope" of 'Forefront of Laser Technology', published on Nov. 30, 1992 from Nikkei Gijutsu Tosho Co., Ltd.; pp. 222–229.

Primary Examiner—C. L. Albritton
Attorney, Agent, or Firm—Cushman, Darby & Cushman

[57] ABSTRACT

A laser beam is irradiated and scanned on a substrate of a liquid crystal display device of an active matrix type. Pairs of electrons and holes caused by the known internal photoelectric effect are produced by irradiation of the laser beam to electrical conductive thin films including silicon layered on the substrate, and pass through a defective part of short circuit in an intersection of the plural electrical conductive thin films, and thereby a current flowing through the intersection increases and a position of the defect determined on the basis of the scanning position of the laser beam and the increase of the current.

3 Claims, 6 Drawing Sheets

DEFECT DETECTION AND DEFECT REMOVAL APPARATUS OF THIN FILM ELECTRONIC DEVICE

FIELD OF THE INVENTION AND RELATED ART STATEMENT

1. Field of the Invention

The present invention relates generally to a defect detection apparatus of a thin film electronic device, and particularly useful for a defect detection apparatus for a liquid crystal display device of an active matrix type having a plurality of thin film transistors on a substrate and an apparatus for removing the defect.

2. Description of the Related Art

In a liquid crystal display device of an active matrix type (hereinafter is referred to as AM-LCD), a thin film transistor is disposed on each display element representing a pixel of the liquid display device and controls the display element. On a substrate for such device, several ten thousands through several millions of the display elements are arranged, and the same number of thin film transistors are disposed on the same substrate. In the AM-LCD, if one of these display elements and the thin film transistors are defective, there arises a defective line, and the whole display element is not activated correctly, and consequently such an AM-LCD cannot serve as a satisfactorily complete display device.

In general, it is not easy to fabricate the thin film electronic device having the huge number of elements on one substrate without a single defect, and therefore a yield rate in the fabricating process is relatively low. In order to improve the low yield rate, various methods for repairing the defect have been developed in recent years. The repair is made preferably before assembly of the AM-LCD.

The AM-LCD comprises two glass substrates. On a first substrate, a plurality of electrodes for forming the display elements and the respective thin film transistors for controlling the display elements are formed with wirings of electric conductive thin films for connecting between them. A common electrode is formed on a second substrate and face to the electrodes of the first substrate when both the substrates are assembled. On the first substrate, matrix wirings of vertical and horizontal directions are disposed on the substrate to designate a target display element. The matrix wirings are formed by multilayers of vertical and horizontal stripes of polysilicon including an impurity or those of amorphous silicon, for example, and the crossing stripes are insulated from each other at their intersections by a dielectric substance such as silicon nitride or silicon dioxide. On the other hand, the gate electrodes and the source electrodes of the thin film transistor intersect with each other by sandwiching the dielectric substance layer therebetween. In a similar manner, the gate electrodes and the drain electrodes of the thin film transistor intersect with each other by sandwiching the dielectric substance layer. If a defect exists on the dielectric substance layer at the intersections, the wirings are liable to short-circuit or result in the breaking of the wirings. The breaking of the wiring is also susceptible to occurrence at the intersection.

In order to resolve the above-mentioned problem. double-wiring structure having two wirings disposed in parallel may be employed at the intersection parts of the conductive thin films. The double-wiring structure can maintain connection, even if one of the double-wirings is broken. In the double-wiring structure, the defect due to break of the wiring is expected to decrease, but the defect due to short circuit is liable to increase on the contrary, because the intersections of the wiring increase. In the double-wiring structure, when one of two wirings is short-circuited, the short-circuited wiring is separated from a circuit by breaking it by a laser beam. In general, a probability that both wirings of the double-wiring structure are broken or short-circuited is relatively low, and therefore, the yield rate is significantly improved by removing the defect by the above-mentioned method. As to the thin film transistors of the AM-LCD, two thin film transistors having the same configuration are mounted in parallel in advance, when a defect has arisen on one of two thin film transistors, the defective thin film transistor is separated from the circuit to remove the defect.

In the above-mentioned double-wiring structure for removing purposes of the defect, it is an important problem to find the intersection or the transistor having the defect. In the prior art to solve the problem, a predetermined voltage is applied to the matrix wirings of the conductive thin film in turn, and a current is measured. When a wiring flowing an abnormal current is found, the defect of the double-wirings is searched by an optical microscope, for example the searched defect is removed by irradiation of the laser beam. In the conventional defect detection method mentioned above, there is a difficulty in detection of entire defects. A slight defect cannot be detected even with the optical microscope by human eye inspection. Moreover, such an inspection operation is relatively lower in working efficiency. Therefore, accurate and perfect detection and removal of the short circuit defect by application of the double-wiring structure is required to be operated with a higher efficiency and accuracy.

OBJECT AND SUMMARY OF THE INVENTION

An object of the present invention is to provide a defect detection apparatus of a thin film electronic device for detecting accurately a position of a defect in the thin film electronic device.

The other object of the present invention is to provide a removing apparatus of the defect.

The defect detection apparatus of the thin film electronic device in accordance with the present invention comprises:

laser beam generating means for generating a laser beam having a beam diameter which is smaller than a diameter of an object to be detected in the thin film electronic device, optical means for scanning the laser beam generated by the laser beam generating means on plural conductive thin films laminated on a substrate by sandwiching a dielectric substance layer therebetween, a voltage generator for applying a predetermined voltage of a direct current across the plural thin films laminated on the substrate, current detection means for measuring a current supplied from the voltage generator, a control circuit for comparing a first current value, which is supplied from the voltage generator under non-irradiation of the laser beam to the plural conductive thin films, with a second current value, which is supplied from the voltage generator under irradiation of the laser beam to the plural conductive thin films, and determining existence of a defect of short circuit between the plural conductive thin films at a position irradiated by the laser beam on the basis of a difference between the first current value and the second current value.

A defect detection and defect removal apparatus of a thin film electronic device in accordance with the present invention comprises:

first laser beam generating means for generating a first laser beam having a beam diameter being smaller than a size of an object to be detected on plural conductive thin films laminated a dielectric substance layer in the thin film electronic device, second laser beam generating means for generating a second laser beam capable of burning out the plural conductive thin films, first optical means for scanning the first laser beam on the plural conductive thin films, a voltage generator for applying a voltage of a direct current across the plural conductive thin films, current detection means for measuring a current value supplied from the voltage generator, a control circuit for comparing a first current value supplied from the voltage generator under non-irradiation of the first laser beam with a second current value supplied from the voltage generator under irradiation of the first laser beam for determining a position of a defect of short circuit between the plural conductive thin films irradiated by the first laser beam on the basis of a difference between the first current value and the second current value, and for controlling the second laser beam to remove the defect of short circuit by burning out a part of the plural conductive thin films.

DESCRIPTION OF THE PREFERRED EMBODIMENT

Figure 1:
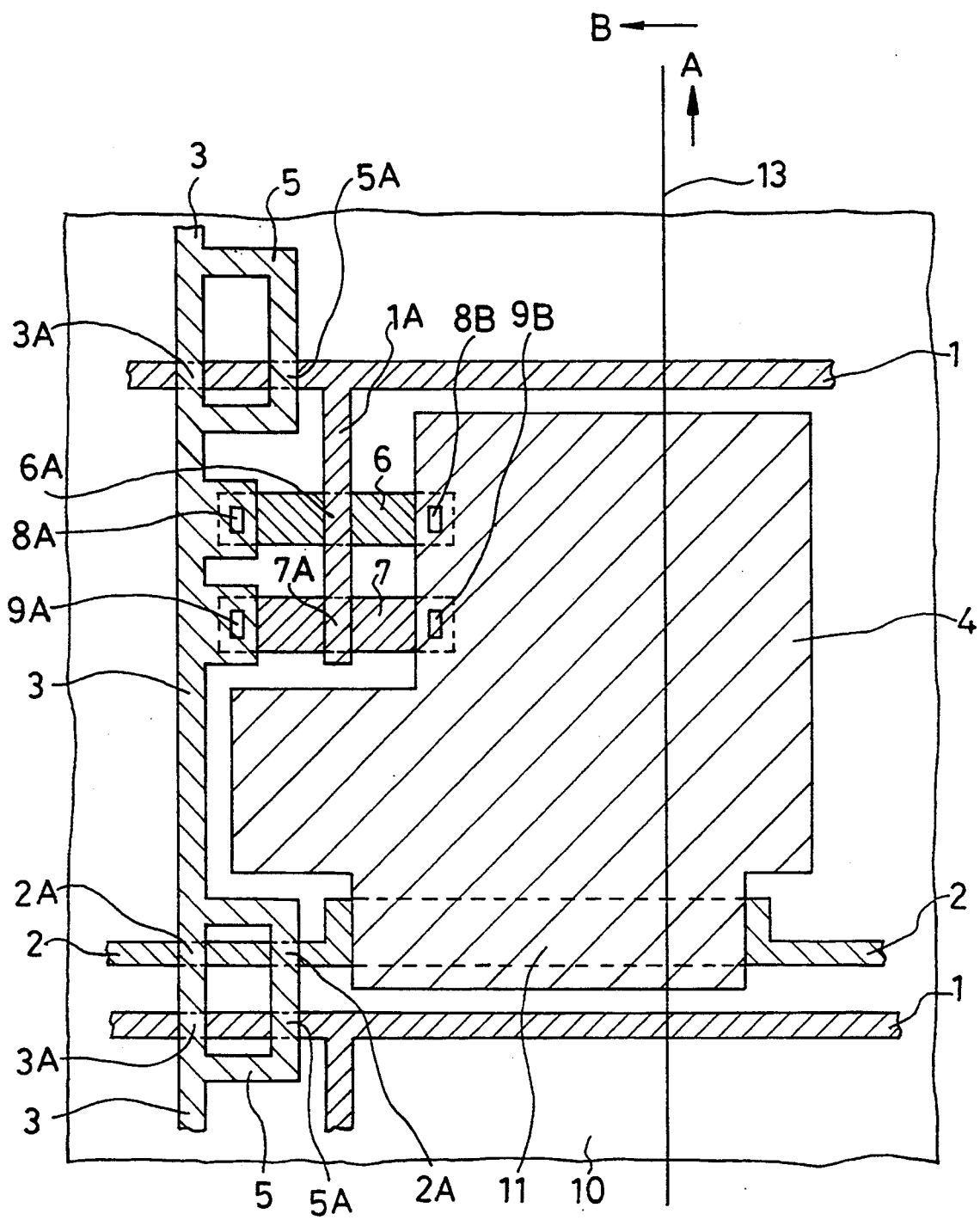
FIG. 1 is a plan view of a display element of one pixel of a liquid crystal display device of an active matrix type having a double-wiring structure.

FIG. 1 is a plan view of a display element of one pixel of a liquid crystal display device of an active matrix type (AM-LCD), formed on a glass substrate 10. Referring to FIG. 1, horizontal wirings 1 and common wirings 2 are formed by a polysilicon layer doped with impurity. Vertical wirings 3 are formed by a multi-lamination layer of aluminum alloy containing silicon of about 2% and a polysilicon layer doped with impurity. A bypass wiring 5 is connected to the vertical wiring 3 in regions of intersections of the horizontal wiring 1, the common wiring 2 and the vertical wiring 3. A thin film of dielectric substance such as silicon nitride or oxide silicon is placed between the horizontal wiring 1 and the vertical wiring 3 and between the common wiring 2 and the vertical wiring 3 at the respective intersections so that they are electrically isolated. The above-mentioned materials are well known in the art, and are employed in the product of the AM-LCD at the present state of technology. Moreover, semiconductor layers 6 and 7 are formed on the glass substrate 10, and two thin film transistors 6A and 7A (hereinafter is referred to as TFT) are formed by combining a branch wiring 1A of the horizontal wiring 1.

Figure 2:
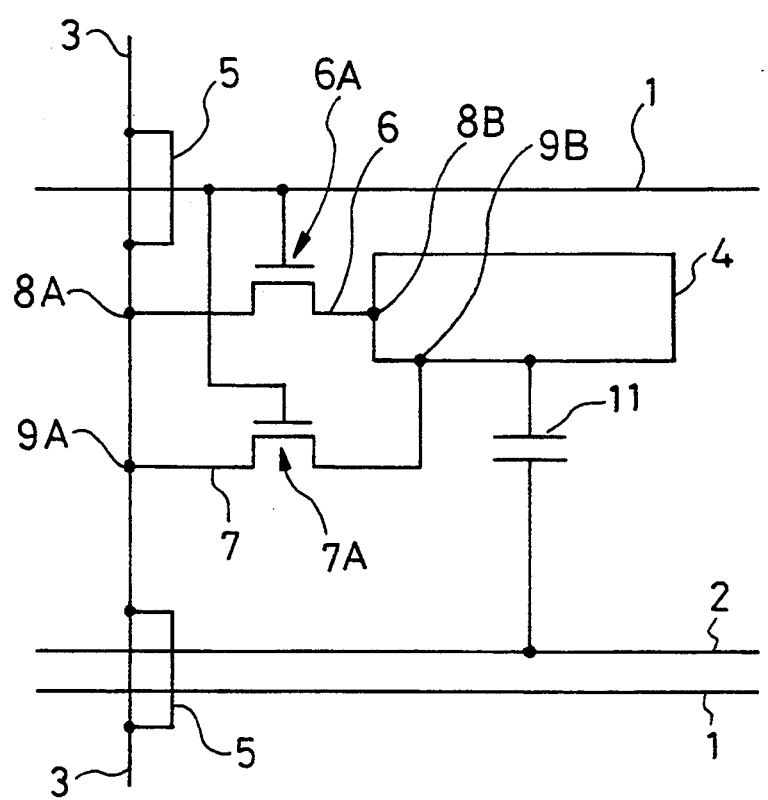
FIG. 2 is an equivalent circuit of the display element shown in FIG. 1.

The semiconductor layers 6 and 7 are connected to the vertical wiring 3 by respective contact pits 8A and 9A, and are connected to a pixel electrode 4 of a conductive thin film formed on the glass substrate 10 by other contact pits 8B and 9B. A visible display element of one pixel is constructed by the electrode 4. A part of the electrode 4 is faced to a widened region of the common wirings 2, and a dielectric substance layer intermediates between them, and thereby, a capacitor 11 is formed. The AM-LCD substrate comprises a plurality of the display elements shown in FIG. 1 arranged in both the vertical and horizontal directions. An equivalent circuit of the display element is shown in FIG. 2.

After fabrication of the AM-LCD substrate having the plurality of display devices, the AM-LCD substrate is transferred to an inspection process as described below.

Figure 3:
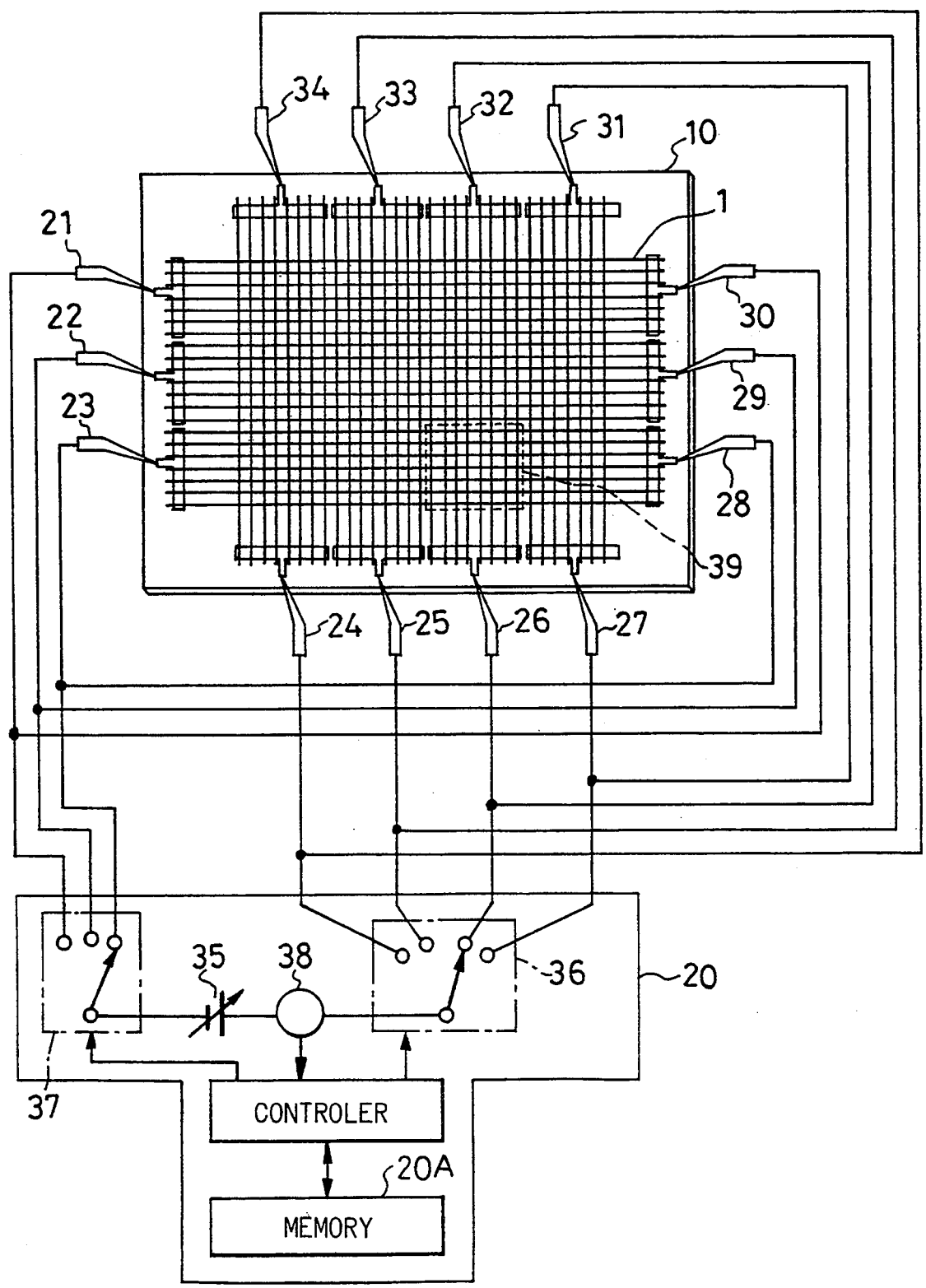
FIG. 3 is a block diagram of a leak current inspection apparatus which detects a block having a defect of the liquid crystal display device of the active matrix type.

In the inspection process, first, an entire area of the AM-LCD substrate is divided into a plurality of blocks, and a leak current of each block is detected by a conventional leak current inspection apparatus 20. A connecting diagram of the leak current inspection apparatus 20 is known in the art and is shown in FIG. 3. Referring to FIG. 3, "horizontal wiring pairs" composed of each pair of the horizontal wiring 1 and the common wiring 2 are divided into a predetermined number of group (in FIG. 3, the horizontal wiring pairs are divided into three groups each having seven horizontal wiring pairs), and the horizontal wirings 3 are divided into a second predetermined number of group (in FIG. 3, the horizontal wirings 3 are divided into four groups each having eight vertical wirings 3). The entire horizontal wiring pairs in each group are connected in common, and the entire vertical wirings 3 in each group are also connected in common. Subsequently, probes 21, 22, 23, 28, 29 and 30 are connected to both ends of the respective groups of the horizontal wiring pairs as shown in FIG. 3. On the other hand, probes 24, 25, 26, 27, 31, 32, 33 and 34 are connected to both ends of the respective groups of the vertical wirings 3. Subsequently, a voltage of a direct current power source 35 is applied to the probes selected by selecting switches 36 and 37 in the leak current inspection apparatus 20. Consequently, a current flowing a particular block of the AM-LCD substrate selected by the respective switching positions of the switches 36 and 37 is measured by an ammeter 38.

For example, when the switches 36 and 37 are at switching positions as shown in FIG. 3, respectively, a current flowing in a block 39 enclosed by a dotted line is measured. Reference current values which flow in non-defective state of respective block are stored in a memory 20A of the leak current inspection apparatus 20 in advance, and measured current values of the glass substrate 10 to be inspected are compared with the reference current values. When a difference between one of the measured current value and the corresponding reference current value exceeds a predetermined deviation, it is determined that the defect of short circuit exists in the block 39. After determination of any block having a defect as mentioned above, a subsequent inspection process is applied to the AM-LCD substrate in order to determine the position of the defect in the block 39.

Figure 4:
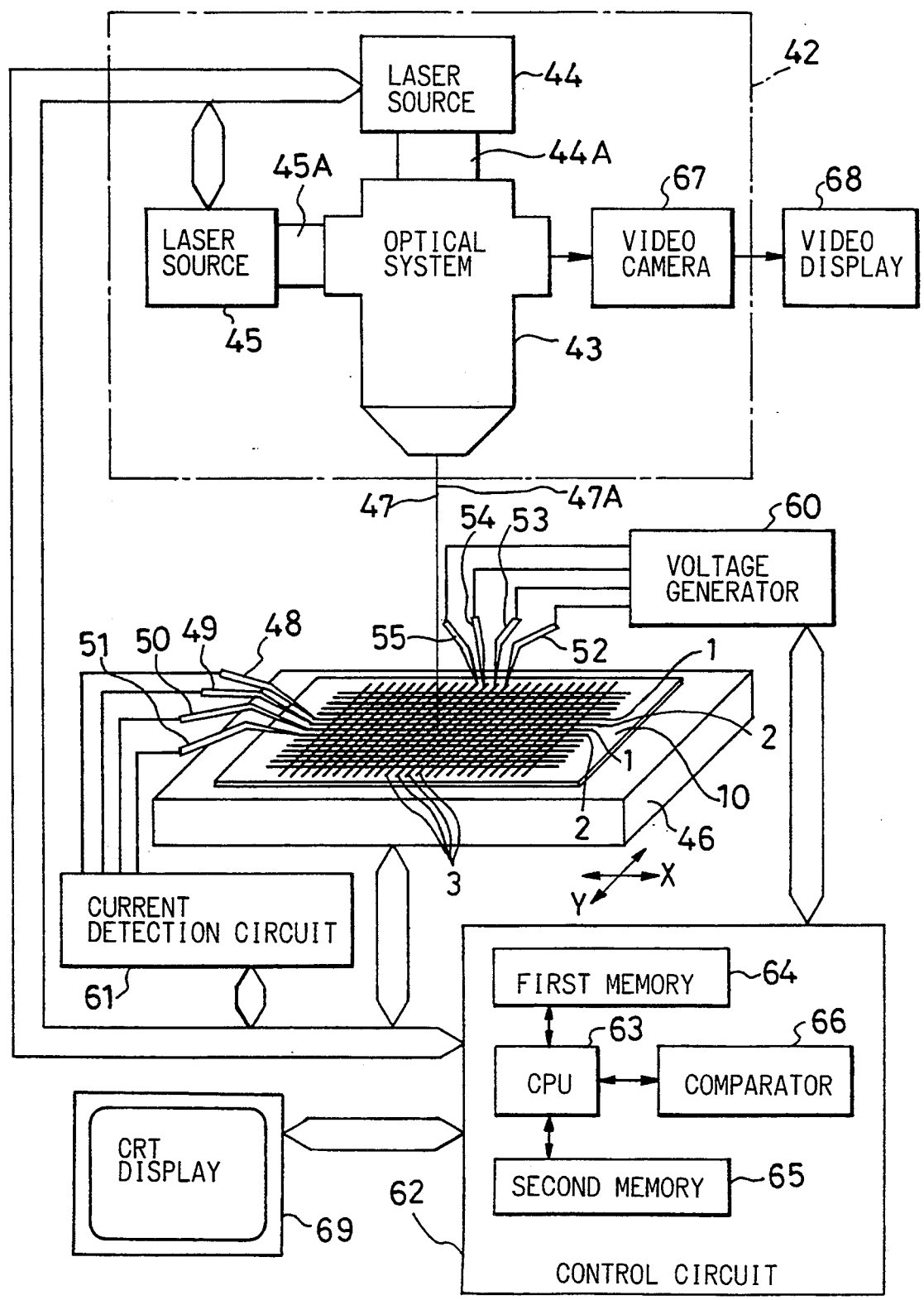
FIG. 4 is a block diagram of an embodiment of the defect detection and defect removal apparatus of a thin film electronic device in accordance with the present invention.

FIG. 4 is a block diagram of an embodiment of the defect detection and defect removal apparatus of the thin film electronic device in accordance with the present invention. Referring to FIG. 4, a laser microscope 42 which irradiates a laser beam 47 or 47A comprises a laser light source 44 for detecting an "optical beam-induced current" (which is in general referred to as OBIC, and hence described so hereinafter) and a laser light source 45 for burning out the wirings. The laser beam 47 or 47A from the laser light source 44 or the laser light source 45 is applied to an object to be inspected through an optical system 43. The diameter of the laser beam is in the range of 0.25 to 1 micron, for example. High speed scanning mechanisms 44A and 45A are installed to the optical system 43, and the respective laser beams are deflected within a predetermined range. The high speed scanning mechanisms 44A and 45A are well known in the art and therefore the detailed description is omitted.

The substrate 10 of the AM-LCD to be inspected is mounted on an X-Y stage 46 facing to the optical system 43. The X-Y stage 46 is shifted in X and Y directions by an accurate driving mechanism (not shown), and the entire area of the substrate 10 is scanned by the laser beam 47. In the defect detection and defect removal apparatus, the block 39 having the defect detected by the above-mentioned leak current inspection apparatus 20 is inspected.

Probes 48, 49, 50 and 51 of the defect detection and defect removal apparatus are connected to neighboring two horizontal wirings 1 and two common wirings 2, respectively. Moreover, probes 52, 53, 54 and 55 are connected to neighboring four vertical wirings 3, respectively. A predetermined voltage of a direct current generated by a voltage generator 60 is applied across a group of the probes 48 through 51 and a group of probes 52 and 53. And a current flowing between a probe selected from the probe 48 through 51 and a probe selected from the probes 52 through 55 is detected by a current detection circuit 61. The selecting operation of the probes 48 through 51 and 52 through 55 is controlled by a control circuit 62, and the current is measured with respect to entire combinations between the probes 48 through 51 and the probes 52 through 55. In the state that the laser beam 47 is not irradiated to the substrate 10, the current is caused by existence of a short circuit defect among the vertical wirings 3, horizontal wirings 2, the common wirings 1, the TFTs 6A, 7A and the capacitor 11. When the laser beam 47 is irradiated to the substrate 10, the current increases. The increase of the current is caused by an "internal photoelectric effect" of the thin film electronic device at irradiation by the laser beam 47.

The internal photoelectric effect of the thin film electronic device is caused by pairs of electrons and holes generated in a semiconductive substance by irradiation of the laser beam to the thin film of the semiconductive substance. The electrons and holes (hereinafter is referred to as carrier) are moved to the respective directions by a voltage applied to the semiconductive substance, and thereby a current flows. The current is known as the Optical Beam-Induced Current (OBIC). In the defect detection and defect removal apparatus in accordance with the present invention, since the wirings in the AM-LCD to be inspected is formed by a semiconductive material such as aluminum including silicon as mentioned above, the OBIC is generated by the internal photoelectric effect. The OBIC is utilized to pinpoint accurately the position of the defect in the block having the defect detected by the above-mentioned leak current inspection apparatus 20.

In the case that the defect of short circuit exists in the display element shown in FIG. 1, positions of the defect are intersections 3A which are crossings of the horizontal wirings 1 and the vertical wiring 3, intersections 2A and 4A which are crossings of the common wiring 2 and the vertical wiring 3, the TFTs 6A and 7A and the capacitor 11. The diameter (0.25 through 1 micron) of the laser beam 47 from the laser microscope 42 is made sufficiently smaller than a line width (about 10 micron) of the horizontal wiring 1 and the vertical wiring 3. The voltage which is generated by the voltage generator 60 in FIG. 4 is set to such a relatively low level that the intersection having the defect of short circuit is not burnt out by the short circuit current.

A control circuit 62 comprises a CPU 63, a first memory 64, a second memory 65 and a comparator 66. "Reference current value data" is stored in the first memory 64 in advance. The reference current value data comprises data of each position which is scanned by the laser beam 47 of the laser microscope 42 and data of the current value at each position of the block to be inspected. A video camera 67 may be installed in the optical system 43 of the laser microscope 42, and thereby an optical image enlarged by the optical system 43 is displayed on the video display device 68 such as a CRT as a video image.

In operation of defect detection in the block to be inspected, the laser beam 47 scans on the block to be inspected from one end to the other end. In FIG. 1, a straight line 13 represents a way of scanning of the laser beam 47 which scans in the direction shown by an arrow A. The way is successively shifted to the direction shown by an arrow B, for example, and thus the entire area of the block to be inspected is scanned.

Since the short circuit defect exists in the block to be inspected, a short circuit current flows through the short circuit defect by applying the voltage of the voltage generator 60. The short circuit current is stored in the first memory 64. Subsequently, the scanning operation of the laser microscope 42 is started. The data of irradiated positions of the laser beam 47 and the data of current values corresponding to the irradiated positions are stored in the second memory 65 of the control circuit 62. When the laser beam 47 scans on a non-defective part of the block, for example on the horizontal wiring 1, the common wiring 2 or the vertical wiring 3, carriers are produced by the internal photoelectric effect at the instant the laser beam 47 is irradiated on the non-defective part. In this case the carriers cannot pass through the horizontal wiring 1 and the vertical wiring 3 because there is the dielectric substance between them. Therefore, when the laser beam 47 scans on the non-defective part, only the short circuit current flows.

When the laser beam 47 is irradiated on the short circuit defect part of an intersection, the carriers produced by the internal photoelectric effect flow through the short-circuited part of the intersection. Consequently, the current value which is detected by the current detection circuit 61 increases. The increase of the current is caused by the OBIC. Namely, the defect of short circuit exists at the position which increases in current by irradiation of the laser beam 47. In general, the OBIC value is from ten to several ten nanoamperes, and therefore there are occasions where the OBIC cannot be detected in the event that the short circuit current value is much larger than the OBIC value. However, in the case of the larger short circuit current than mentioned above, there is a large scale defect of short circuit in a relatively large area of the intersection. Therefore, the large scale defect can be detected by the conventional optical microscope. The large scale defect may be found through a video image on the video display 68 of the video camera 67 mounted on the laser microscope 42.

On the other hand, in the case of a slight short circuit defect which cannot be found by human eye inspection using the optical microscope, the OBIC is useful in detection, because the short circuit current is relatively smaller and the ratio of the OBIC to the short circuit current is large. That is, the slight short circuit defect of less than several hundred nanoamperes in the short circuit current can be found by detecting the OBIC. The data of a position irradiated by the laser beam 47 and the data of the current value at the position are stored in the second memory 65. The data stored in the second memory 65 is compared with the reference current data stored in the first memory 64 by the comparator 66, and a position where the current value increases, namely the position of the defect of the short circuit, is accurately determined. The above-mentioned operation is controlled by the CPU 63. The determined position of the defect is also stored in the second memory 65.

Figure 5:
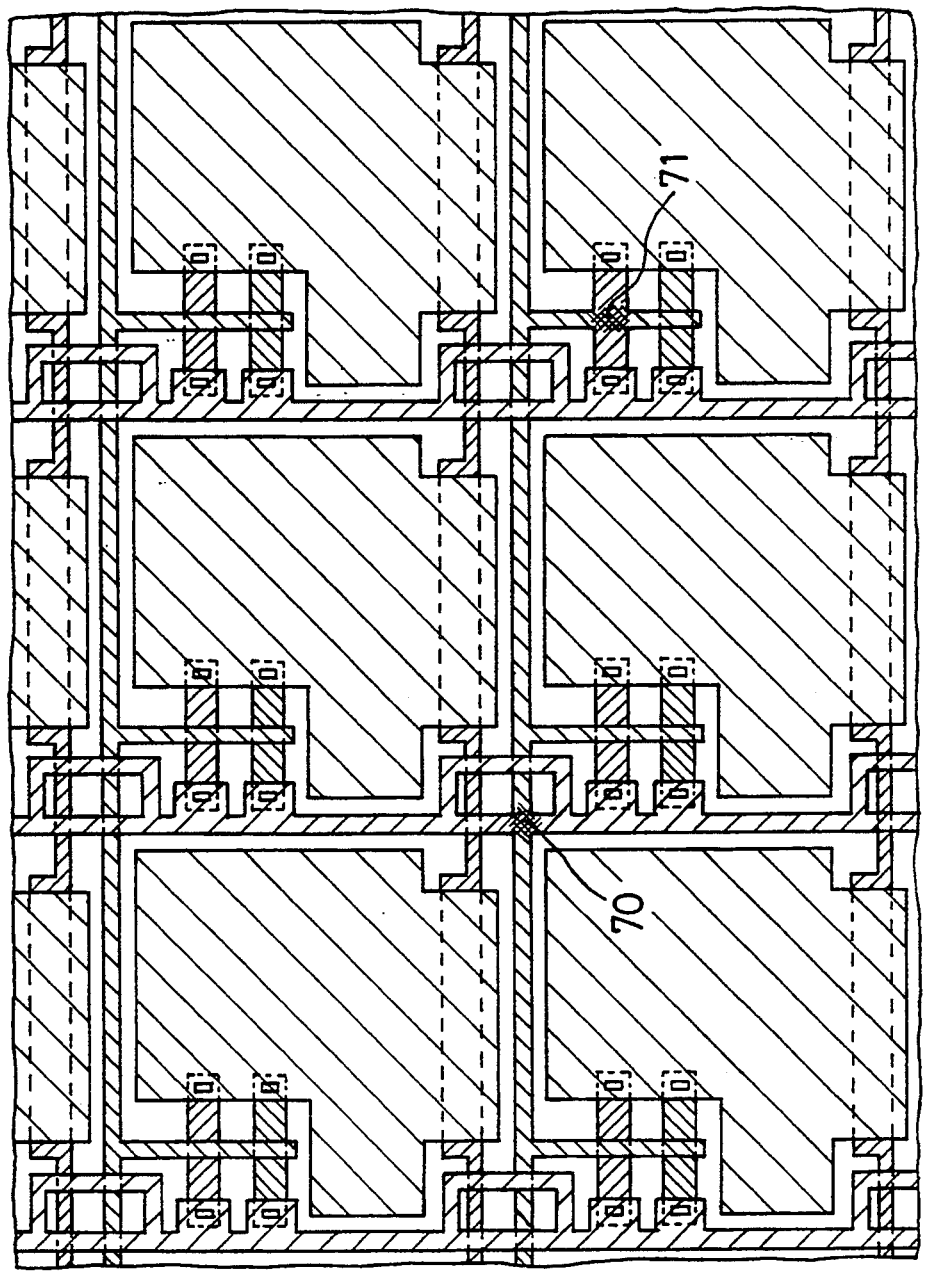
FIG. 5 is a plan view of a part of the liquid crystal display device of the active matrix type having defects to be detected and removed.

The position of the defect may be displayed on a CRT display device 69 as an "OBIC image" based on the data stored in the second memory 65, and one can observe the position of the defect. FIG. 5 is the OBIC image of a part of the AM-LCD having defects 70 and 71 of the short circuit detected by the OBIC and is displayed on the CRT display device 69. The pattern of the AM-LCD is displayed on the CRT display device 69 by a separate display circuit (not shown) and is superimposed on the OBIC image. The defects 70 and 71 are displayed by respective bright spots, for example.

Figure 6:
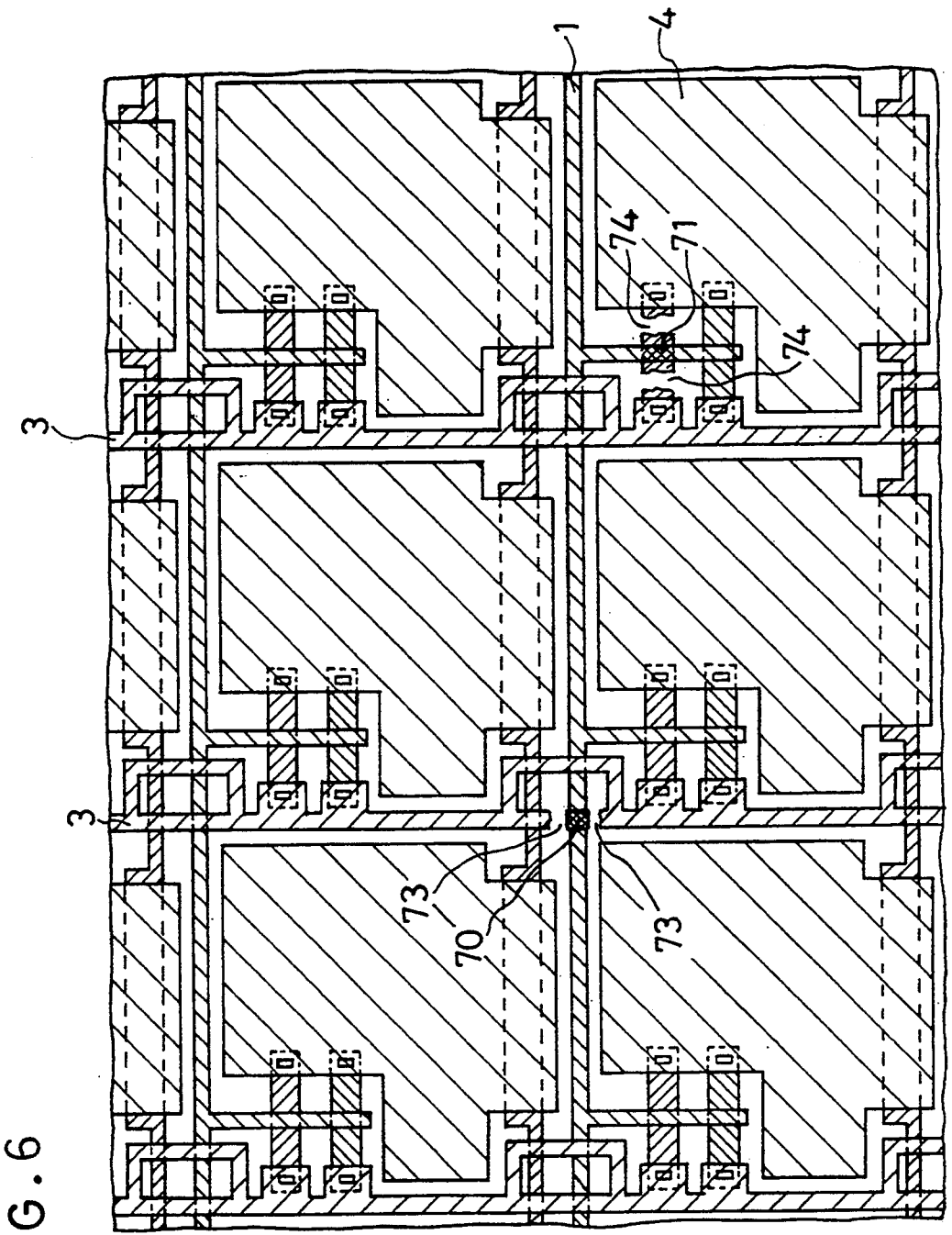
FIG. 6 is a plan view of the part of the liquid crystal display device in a state that the defects shown in FIG. 5 are removed.

After determination of the position of the short circuit defect, the defects may by removed by process as described below. The light source of the laser microscope 42 shown in FIG. 4 is changed to the laser light source The intensity of the laser beam 47A of the laser light source 45 is higher than that of the laser light source 44, and the thin film of the wiring is burnt out by irradiation of the laser beam 47A from the laser light source 45. The laser light beam 47A is scanned on the pattern shown in FIG. 6 on the basis of the positional data of the defects detected in the above-mentioned defect detection process and stored in the second memory 65, and is irradiated to regions 73 and 74 of the thin film to burn out. Consequently, the defect 70 of short circuit is removed from the vertical wiring 3, and the TFT 71 is also removed from the pixel electrode 4 and the vertical wiring 3. One can observe the state of the defect removed through the above-mentioned process in the video image of the video display 68.

In the above-mentioned embodiment, though the laser beam 47 is applied to the front surface of the substrate 10, the same effect is realizable in the case that the laser beam 47 is applied to the reverse surface of the substrate 10.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A defect detection apparatus of a thin film electronic device comprising:

laser beam generating means for generating a laser beam having a beam diameter which is smaller than a diameter of an object to be detected in the thin film electronic device, optical means for scanning said laser beam generated by said laser beam generating means on plural conductive thin films laminated on a substrate by sandwiching a dielectric substance layer therebetween, a voltage generator for applying a predetermined voltage of a direct current across said plural thin films laminated on said substrate, current detection means for measuring a current supplied from said voltage generator, a control circuit for comparing a first current value, which is supplied from said voltage generator under non-irradiation of said laser beam to said plural conductive thin films, with a second current value, which is supplied from said voltage generator under irradiation of said laser beam to said plural conductive thin films, and determining existence of a defect of short circuit between said plural conductive thin films at a position irradiated by said laser beam on the basis of a difference between said first current value and said second current value.

2. A defect detection apparatus in accordance with claim 1, wherein said control circuit comprises a first memory for storing first data of a current measured by said current detection means under non-irradiation state of said laser beam, a second memory for storing second data of a position irradiated by said laser beam and a second current corresponding to said position, comparison means for comparing said second current of said second data with said first current of said first data and deriving a current difference between said first current and said second current, and control means for storing in said second memory the data of said position irradiated by said laser beam at an instant said current difference is detected.

3. A defect detection and defect removal apparatus of a thin film electronic device comprising:

first laser beam generating means for generating a first laser beam having a beam diameter being smaller than a size of an object to be detected on plural conductive thin films laminated a dielectric substance layer in said thin film electronic device, second laser beam generating means for generating a second laser beam capable of burning out said plural conductive thin films, first optical means for scanning said first laser beam on said plural conductive thin films, a voltage generator for applying a voltage of a direct current across said plural conductive thin films, current detection means for measuring a current value supplied from said voltage generator, a control circuit for comparing a first current value supplied from said voltage generator under non-irradiation of said first laser beam with a second current value supplied from said voltage generator under irradiation of said first laser beam for determining a position of a defect of short circuit between said plural conductive thin films irradiated by said first laser beam on the basis of a difference between said first current value and said second current value, and for controlling said second laser beam to remove said defect of short circuit by burning out a part of said plural conductive thin films.

* * * * *